(12) United States Patent
Diamantopoulos et al.

(10) Patent No.: US 11,557,876 B2
(45) Date of Patent: Jan. 17, 2023

(54) SEMICONDUCTOR LASER

(71) Applicant: Nippon Telegraph and Telephone Corporation, Tokyo (JP)

(72) Inventors: Nikolaos-Panteleimon Diamantopoulos, Tokyo (JP); Takaaki Kakitsuka, Tokyo (JP); Shinji Matsuo, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 71 days.

(21) Appl. No.: 17/056,360

(22) PCT Filed: May 28, 2019

(86) PCT No.: PCT/JP2019/021066
§ 371 (c)(1),
(2) Date: Nov. 17, 2020

(87) PCT Pub. No.: WO2019/230712
PCT Pub. Date: Dec. 5, 2019

(65) Prior Publication Data
US 2021/0184427 A1 Jun. 17, 2021

(30) Foreign Application Priority Data
May 30, 2018 (JP) .............................. JP2018-103099

(51) Int. Cl.
*H01S 5/0625* (2006.01)
*H01S 5/062* (2006.01)
(Continued)

(52) U.S. Cl.
CPC ...... *H01S 5/06258* (2013.01); *H01S 5/06226* (2013.01); *H01S 5/06236* (2013.01);
(Continued)

(58) Field of Classification Search
CPC . H01S 5/12–125; H01S 5/06226–0623; H01S 5/06255–06258
See application file for complete search history.

(56) References Cited

U.S. PATENT DOCUMENTS

| 5,132,978 A * | 7/1992 | Marshall ............... H01S 5/5009 372/27 |
| 5,185,754 A * | 2/1993 | Craig .................... H01S 5/1021 372/50.1 |

(Continued)

FOREIGN PATENT DOCUMENTS

| DE | 4232764 A1 * | 3/1994 | ........... H01S 5/4031 |
| EP | 0358144 A1 * | 3/1990 | |

(Continued)

OTHER PUBLICATIONS

Wake et al. "Optical Generation of Millimeter-Wave Signals for Fiber-Radio Systems Using a Dual-Mode DFB Semiconductor Laser", Sep. 1995, IEEE Transactions on Microwave Theory and Techniques, vol. 43, No. 9, 2270-2276 (Year: 1995).*

(Continued)

*Primary Examiner* — Joshua King
(74) *Attorney, Agent, or Firm* — Slater Matsil, LLP

(57) ABSTRACT

A semiconductor laser is provided with: an active layer that excites a transverse electric (TE) mode and a transverse magnetic (TM) mode of light and constitutes at least a part of a resonator guiding the TE mode and the TM mode of light; and a diffraction grating as a frequency difference setting structure that sets the difference in oscillation frequency between the TE mode and the TM mode of light higher than a relaxation-oscillation frequency.

12 Claims, 7 Drawing Sheets

(51) Int. Cl.
  *H01S 5/10* (2021.01)
  *H01S 5/12* (2021.01)
(52) U.S. Cl.
  CPC ............. *H01S 5/1003* (2013.01); *H01S 5/12* (2013.01); *H01S 5/0623* (2013.01); *H01S 5/1053* (2013.01); *H01S 5/1064* (2013.01)

(56) References Cited

U.S. PATENT DOCUMENTS

| | | | | | |
|---|---|---|---|---|---|
| 5,358,898 | A | * | 10/1994 | Ogita | H01S 5/04256 438/32 |
| 5,499,256 | A | * | 3/1996 | Bischel | H01S 5/141 372/12 |
| 5,699,373 | A | * | 12/1997 | Uchida | H01S 5/34 372/27 |
| 5,809,047 | A | * | 9/1998 | Nitta | H01S 5/06256 372/18 |
| 5,862,165 | A | * | 1/1999 | Handa | H01S 5/06258 372/27 |
| 5,878,066 | A | * | 3/1999 | Mizutani | H01S 5/12 372/27 |
| 6,030,452 | A | * | 2/2000 | Takeuchi | H01L 21/02433 438/289 |
| 6,430,204 | B1 | * | 8/2002 | Tanaka | H01S 5/1003 372/46.01 |
| 6,438,148 | B1 | * | 8/2002 | Hui | H01S 5/1228 398/154 |
| 6,501,776 | B1 | * | 12/2002 | Numai | H01S 5/068 372/45.01 |
| 6,518,159 | B1 | * | 2/2003 | Tsunoda | H01S 5/2231 438/46 |
| 7,541,204 | B2 | * | 6/2009 | Iino | H01S 5/22 438/22 |
| 2002/0118711 | A1 | * | 8/2002 | Jacquet | H01S 5/06255 372/20 |
| 2003/0147434 | A1 | * | 8/2003 | Hong | H01S 5/1228 372/45.01 |
| 2003/0147441 | A1 | * | 8/2003 | Akulova | H01S 5/06256 372/50.1 |
| 2004/0202208 | A1 | * | 10/2004 | Ungar | B82Y 20/00 372/21 |
| 2004/0208221 | A1 | * | 10/2004 | Ungar | H01S 5/0604 372/96 |
| 2005/0030995 | A1 | * | 2/2005 | Kawakami | H01S 5/22 372/43.01 |
| 2010/0142571 | A1 | * | 6/2010 | Park | B82Y 20/00 372/96 |
| 2012/0020377 | A1 | * | 1/2012 | Kono | H01S 5/227 372/6 |
| 2012/0194893 | A1 | * | 8/2012 | Maleki | G02F 2/002 359/246 |
| 2013/0308959 | A1 | * | 11/2013 | Matsui | H01S 5/0265 372/45.01 |
| 2017/0256912 | A1 | * | 9/2017 | Matsui | H01S 5/12 |

FOREIGN PATENT DOCUMENTS

| | | | | | |
|---|---|---|---|---|---|
| EP | 0671640 | A2 | * | 9/1995 | |
| EP | 1618636 | B1 | * | 7/2015 | ......... H01S 5/06256 |
| JP | H11220210 | A | * | 8/1999 | |
| JP | 2966485 | B2 | * | 10/1999 | |
| JP | 2000151020 | A | * | 5/2000 | |
| JP | 2001085782 | A | * | 3/2001 | ............... H01S 5/10 |
| JP | 2002094176 | A | * | 3/2002 | ............... H01S 5/0657 |
| JP | 2004253776 | A | * | 9/2004 | ............ B82Y 20/00 |
| KR | 100959170 | B1 | | 5/2010 | |
| WO | WO-9724787 | A1 | * | 7/1997 | ............... H01S 5/10 |
| WO | WO-03049242 | A2 | * | 6/2003 | ......... H01S 5/06258 |
| WO | WO-03049242 | A3 | * | 3/2004 | |
| WO | WO-2005091451 | A1 | * | 9/2005 | ......... H01S 5/06256 |
| WO | WO-2006077766 | A1 | * | 7/2006 | ............ H01L 21/20 |
| WO | WO-2007085573 | A1 | * | 8/2007 | ............. H01S 5/065 |
| WO | WO-2010111689 | A2 | * | 9/2010 | ......... H01S 5/06258 |
| WO | WO-2017220144 | A1 | * | 12/2017 | |

OTHER PUBLICATIONS

Matsui et al. "Beat Frequency Generation Up to 3.4 THz from Simultaneous Two-Mode Lasing Operation of Sampled-Grating DBR Laser", Mar. 18, 1999, Electronics Letters, vol. 35, No. 6, 1-2 (Year: 1999).*

HyperPhysics, "Beats", Apr. 7, 2000, https://web.archive.org/web/20000407174556/http://hyperphysics.phy-astr.gsu.edu/hbase/Sound/beat.html, Retrieved Jun. 13, 2022. (Year: 2000).*

Morthier et al., "Extended Modulation Bandwidth of DBR andExternal Cavity Lasers by Utilizing a CavityResonance for Equalization," IEEE Journal of QuantumElectronics, vol. 36, No. 12, Dec. 2000, pp. 1468-1475.

Matsui et al., "55 GHz Bandwidth Distributed Reflector Laser," Journal of Lightwave Technology, vol. 35, No. 3, 2017, pp. 397-403.

* cited by examiner

SEMICONDUCTOR LASER

CROSS-REFERENCE TO RELATED APPLICATIONS

This application is a national phase entry of PCT Application No. PCT/JP2019/021066, filed on May 28, 2019, which claims priority to Japanese Application No. 2018-103099, filed on May 30, 2018, which applications are hereby incorporated herein by reference.

TECHNICAL FIELD

The present invention relates to a semiconductor laser and particularly relates to a structure of a semiconductor laser used as a light source of an optical transmitter.

BACKGROUND

In recent years, due to an explosive increase in network traffic amount accompanying the spread of the Internet, an increase in speed and capacity of optical fiber transmission is remarkable. Semiconductor lasers have been developed as light source devices that support optical fiber communication. Especially, a realization of a single-mode light source using a distributed feedback (DFB) laser has greatly contributed to increases in the speed and capacity of the optical fiber communication by time division multiplexing and wavelength division multiplexing (WDM).

In recent years, optical communication has been applied not only to telecommunication areas such as core networks and metro networks but also to short-distance data communications between data centers, between racks, and between boards. 100-Gb Ethernet (registered trademark) has been standardized using a configuration of a WDM type multi-wavelength array light source, and the capacity for data communication is increasing rapidly.

As a semiconductor optical element used in the optical communication as described above, a direct modulation laser is known. The direct modulation laser is a laser for providing intensity modulation by superimposing a signal on an input current of the laser and widely used for a reason of low power consumption, and has become popular in optical fiber networks, particularly in short-range communication. The communication capacity has been steadily increasing irrespective of whether telecommunications or data communications, and in the future, it is desired to realize a high-speed direct modulation laser by further advancing these technologies.

The frequency response of the direct modulation laser is limited by a relaxation-oscillation frequency attributable to the lifetimes of carriers and photons in a resonator. In the general structure, the relaxation-oscillation frequency is up to about 30 GHz, and there is a limitation in the modulation frequency, which has been problematic. Therefore, in recent years, a proposal has been made to realize a higher frequency response by generating a resonance frequency with a coupled resonator due to a light-light interaction by use of an interaction between a plurality of longitudinal modes (e.g., see Non-Patent Literature 1 and Non-Patent Literature 2).

CITATION LIST

Non-Patent Literature

Non-Patent Literature 1: G. Morthier et al., IEEE J. of Quantum Electron. 36, 12, pp. 1468-1475 (2000), "Extended Modulation Bandwidth of DBR and External Cavity Lasers by Utilizing a Cavity Resonance for Equalization";

Non-Patent Literature 2: Y. Matsui et al., IEEE J. of Lightwave Technol., 35, 3, pp. 397-403 (2017), "55 GHz Bandwidth Distributed Reflector Laser".

SUMMARY OF EMBODIMENTS OF THE INVENTION

Technical Problem

However, the structure of the conventional semiconductor laser described in each of Non-Patent Literature 1 and Non-Patent Literature 2 uses a plurality of longitudinal modes generated by a composite resonator, and it has been difficult to obtain a stable oscillation mode and a faster modulation operation.

An object of embodiments of the present invention, which has been made to solve the problem described above, is to provide a semiconductor laser capable of further improving a frequency response characteristic.

Means for Solving the Problem

In order to solve the problem described above, the semiconductor laser according to embodiments of the present invention is provided with: an active layer that excites two modes of light and constitutes at least a part of a resonator guiding the two modes of light; and a frequency difference setting structure that sets a difference in oscillation frequency between the two modes of light higher than a relaxation-oscillation frequency.

In the semiconductor laser according to embodiments of the present invention, the active layer may have a distributed feedback structure including a diffraction grating periodically formed in a waveguide direction, and the frequency difference setting structure may be formed from the diffraction grating.

In the semiconductor laser according to embodiments of the present invention, the active layer may have a distributed feedback structure, the resonator may further include a waveguide region continuously formed in a waveguide direction of the active layer and having a predetermined length along the waveguide direction, and a reflective mirror continuously formed at an end of the waveguide region on an opposite side to the active layer, and the two modes of light excited by the active layer may be guided in the waveguide region, reflected by the reflective mirror, and fed back to the active layer.

In the semiconductor laser according to embodiments of the present invention, the waveguide region may include a phase adjustment region that adjusts a phase of the two modes of light.

In the semiconductor laser according to embodiments of the present invention, the waveguide region may include a polarization rotation region that rotates a polarization plane of the two modes of light.

In the semiconductor laser according to embodiments of the present invention, the active layer may be unevenly distributed with respect to a region into which current is injected in a cross-section perpendicular to the waveguide direction of the resonator.

In the semiconductor laser according to embodiments of the present invention, a cross-section of the active layer perpendicular to the waveguide direction of the resonator may have an asymmetric shape.

In the semiconductor laser according to embodiments of the present invention, the two modes of light may be a transverse electric (TE) mode and a transverse magnetic (TM) mode of light.

Effects of Embodiments of the Invention

According to embodiments of the present invention, since the semiconductor laser has the frequency difference setting structure that sets the difference in oscillation frequency between two modes of light higher than the relaxation-oscillation frequency, the semiconductor laser having an improved frequency response characteristic can be realized.

DETAILED DESCRIPTION OF ILLUSTRATIVE EMBODIMENTS

Figure 1A:
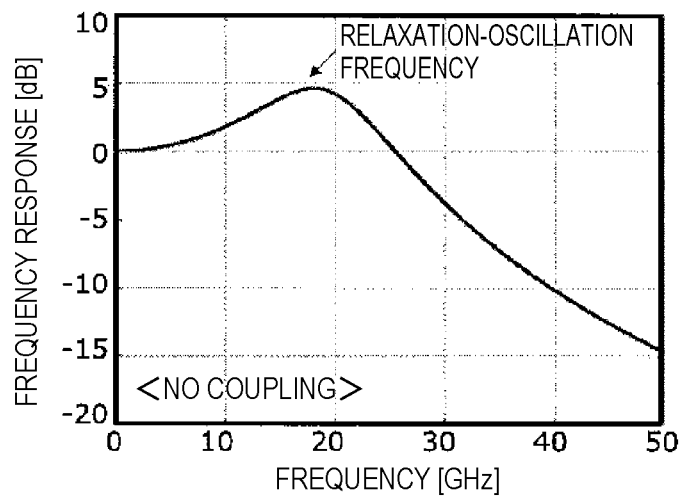
FIG. 1A is a diagram for explaining a principle of a semiconductor laser according to an embodiment of the present invention.

Hereinafter, preferred embodiments of the present invention will be described in detail with reference to FIGS. 1A to 8B. Components common among the figures are denoted by the same reference numerals.

Principle of Embodiments of Invention

First of all, an outline of a semiconductor laser according to an embodiment of the present invention will be described with reference to FIGS. 1A to 1C.

First, FIG. 1A illustrates a frequency response characteristic in a direct modulation-type semiconductor laser of a conventional example. As illustrated in FIG. 1A, the conventionally known direct modulation-type semiconductor laser has a resonance peak only in the vicinity of a relaxation-oscillation frequency.

In contrast, in a direct modulation-type semiconductor laser according to the embodiment of the present invention, two laser beams having different modes and frequencies are resonated. For example, settings are made so that TE mode of light and TM mode of light have different oscillation frequencies and that the frequency difference in oscillation frequency is higher than a relaxation-oscillation frequency. As a result, a light-light resonance frequency is generated on the high-frequency side of the relaxation-oscillation frequency to improve the frequency response characteristic.

Figure 1B:
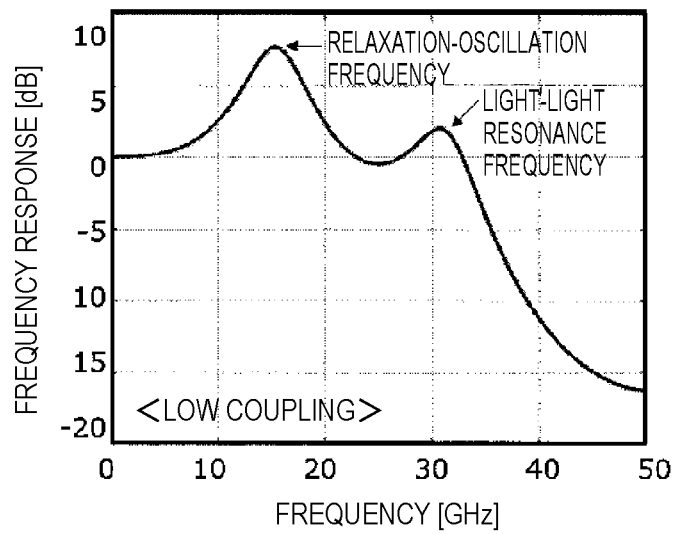
FIG. 1B is a diagram for explaining the principle of the semiconductor laser according to the embodiment of the present invention.
Figure 1C:
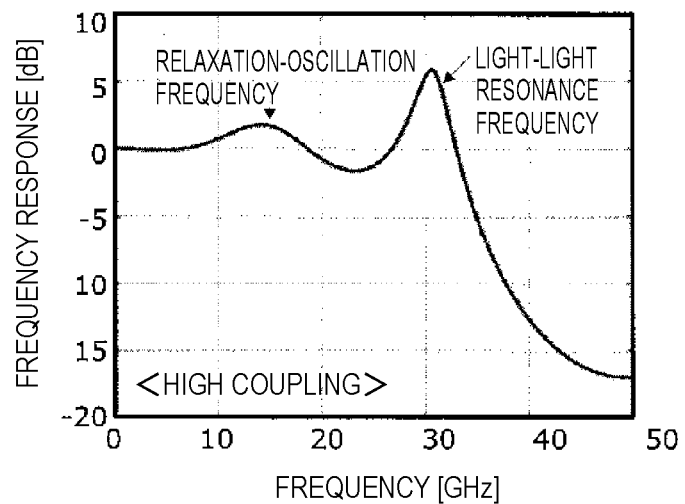
FIG. 1C is a diagram for explaining the principle of the semiconductor laser according to the embodiment of the present invention.

As illustrated in FIGS. 1B and 1C, the higher the coupling between the TE mode and the TM mode, the more the resonance frequency response characteristic is improved. This coupling represents a state where the TE mode and the TM mode can transition to each other in a resonator of the semiconductor laser. When the coupling is zero, the semiconductor laser operates independently in the TE mode and the TM mode.

First Embodiment

A semiconductor laser 1 according to a first embodiment of the present invention will be described with reference to FIGS. 2A and 2B.

Figure 2A:
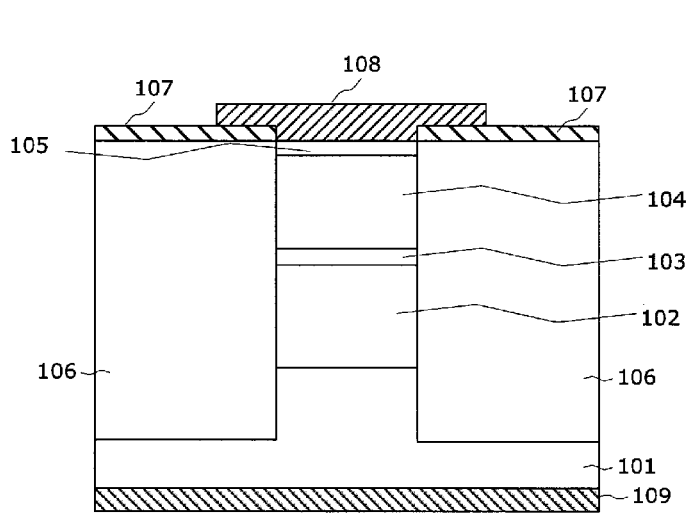
FIG. 2A is a cross-sectional view illustrating a configuration of a semiconductor laser according to a first embodiment of the present invention.

As illustrated in FIG. 2A, the semiconductor laser 1 has a lower cladding layer 101 formed from an n-type semiconductor, an active layer 102 formed on the lower cladding layer 101, and a diffraction grating 103 (described later) formed on the active layer 102. The semiconductor laser 1 further has an upper cladding layer 104 that is formed from a p-type semiconductor formed to sandwich the active layer 102 and the diffraction grating 103 with the lower cladding layer 101, and a contact layer 105 formed on the upper cladding layer 104.

The lower cladding layer 101, the active layer 102, and the upper cladding layer 104 are formed in a stripe structure having a predetermined width. The semiconductor laser 1 has a high-resistance layer 106 formed in contact with the side surface of the stripe structure, and an insulating film 107 formed on the high-resistance layer 106.

The semiconductor laser 1 has the contact layer 105 formed on the upper cladding layer 104, a p-type electrode 108 formed via the contact layer 105, and an n-type electrode 109 formed on the bottom of the lower cladding layer 101. The p-type electrode 108 is electrically connected to the upper cladding layer 104, and the n-type electrode 109 is electrically connected to the lower cladding layer 101.

Figure 2B:
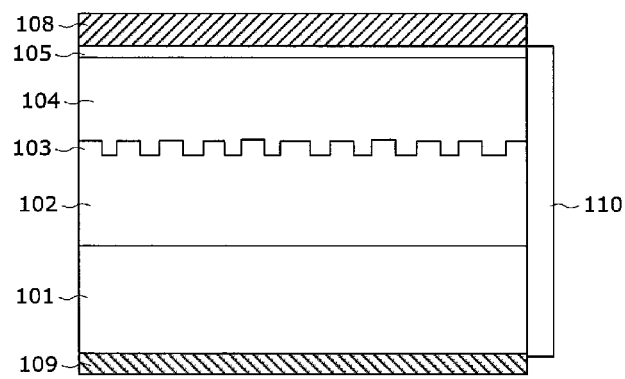
FIG. 2B is a side view illustrating the configuration of the semiconductor laser according to the first embodiment of the present invention.

As illustrated in FIG. 2B, the semiconductor laser 1 has a high-reflection film no on the end face in a waveguide direction.

The active layer 102 has a bulk structure. As illustrated in FIG. 2A, the active layer 102 is formed so that its cross-sectional shape perpendicular to the waveguide direction is a rectangle having an aspect ratio close to 1. Hence the active layer 102 has fundamental modes for the TE mode and the TM mode.

The diffraction grating 103 functions as a frequency difference setting structure that sets the difference in oscillation frequency between the TE mode and the TM mode higher than the relaxation-oscillation frequency. As illustrated in FIG. 2B, the diffraction grating 103 is formed to have an uneven shape with a predetermined diffraction grating pitch along the waveguide direction. A refractive index difference is generated due to the unevenness of the diffraction grating 103, and only light with a specific wavelength is selectively reflected to realize single-mode oscillation. In the present embodiment, the distributed feedback structure is used to selectively oscillate only wavelengths around a Bragg wavelength.

In the present embodiment, the lower cladding layer 101 is formed from, for example, n-type InP cladding formed on an n-type InP substrate. The active layer 102 is made of bulk InGaAsP and has a width of 0.46 μm and a thickness of 0.4 μm. The diffraction grating 103 is InGaAsP having a composition of 1.1Q.

The upper cladding layer 104 is formed from p-type InP. The contact layer 105 is made of p-type InGaAs. The high-resistance layer 106 provided on the side surface of the stripe structure including the active layer 102 is made of InP doped with Fe. Note that the high-resistance layer 106 has a refractive index lower than that of the active layer 102. The insulating film 107 is made of $SiO_2$. The length of the resonator structure made of the diffraction grating 103 illustrated in FIG. 2B in the waveguide direction is 200 μm.

In the present embodiment, an executing refractive index $n_{eqTE}$ of the TE mode is 3.2620, an executing refractive index $n_{eqTM}$ of the TM mode is 3.2609, and an effective refractive index difference is 0.0001. The diffraction grating pitch A of the diffraction grating 103 at this time is set to 238.2 nm corresponding to a Bragg wavelength of 1550 nm. An oscillation frequency difference f between the TE mode and the TM mode is expressed by the following formula (1):

Formula 1

$$f = \frac{c}{2\Lambda}\left|\frac{1}{n_{eqTE}} - \frac{1}{n_{eqTM}}\right| \quad (1)$$

In the above formula (1), c is light speed in a vacuum.

From the above formula (1), "the oscillation frequency difference f between the TE mode and the TM mode=64 GHz" is calculated. This frequency difference f becomes a resonance frequency in the semiconductor laser 1.

As described above, since the active layer 102 has the bulk structure, both the TE mode and the TM mode can be excited. An optical confinement coefficient to the active layer 102 is higher in the TE mode, and hence the main mode is the TE mode. Further, the coupling between the TE mode and the TM mode occurs in the wave-guiding or reflection in the diffraction grating 103, and an increase in the response at the resonance frequency occurs.

The semiconductor laser 1 according to an example of the present embodiment has a relaxation-oscillation frequency up to about 20 GHz, but a competition occurs between the TE mode and the TM mode in the laser region illustrated in FIG. 2B, and a high-speed modulation operation exceeding 80 Gbit/s can be realized by a light-light interaction.

Next, a description will be given of a method for manufacturing the semiconductor laser 1 having the configuration described above. First, a compound semiconductor layer to be the lower cladding layer 101 and the active layer 102 is epitaxially grown on an InP substrate. For example, each layer may be grown by well-known metalorganic vapor-phase epitaxy.

Next, the diffraction grating is formed on the surface of the active layer 102. For example, a resist pattern formed by lithography by electron beam exposure may be used as a mask, and patterning may be performed by predetermined etching to form the diffraction grating 103.

Next, a compound semiconductor layer to be the upper cladding layer 104 and the contact layer 105 is epitaxially grown on a portion where the diffraction grating 103 has been formed.

Subsequently, the grown compound semiconductor layer or the like is patterned by wet etching, dry etching, and the like using a resist pattern prepared by a known photolithography technique as a mask, to form the stripe structure made up of the lower cladding layer 101, the active layer 102, the upper cladding layer 104, and the contact layer 105. After each pattern is formed, the resist pattern is removed.

Next, the high-resistance layer 106 is regrown to be formed on the upper surface of the lower cladding layer 101 (n-type InP substrate) and in a region beside the stripe structure including the active layer 102, thereby embedding the stripe structure.

Thereafter, the insulating film 107 is formed on the high-resistance layer 106 by a predetermined deposition method. After this, an opening is formed in the portion of the contact layer 105 to form the p-type electrode 108 connected to the contact layer 105. Meanwhile, the n-type electrode 109 is formed on the rear surface of the lower cladding layer 101.

As described above, according to the first embodiment, since the oscillation frequency difference between the TE mode and the TM mode is controlled by setting the diffraction grating pitch of the diffraction grating 103 provided on the active layer 102 to the pitch corresponding to the Bragg wavelength, the light-light resonance frequency can be generated at the higher frequency side than the relaxation-oscillation frequency in the semiconductor laser 1. As a result, a modulation band of direct modulation in the semiconductor laser 1 can be improved.

According to the semiconductor laser 1 of the present embodiment, a more stable oscillation mode can be obtained by forming the waveguide structure of only the fundamental modes of the TE mode and the TM mode.

Second Embodiment

Next, a second embodiment of the present invention will be described. In the following description, the same components as those of the first embodiment described above are denoted by the same reference numerals, and description thereof will be omitted.

In the first embodiment, the diffraction grating 103 has been used as the frequency difference setting structure that sets the oscillation frequency difference between the TE mode and the TM mode higher than the relaxation-oscillation frequency. In contrast, in the second embodiment, the control of the difference in oscillation frequency between the TE mode and the TM mode is realized by using feedback by a waveguide.

Figure 3:
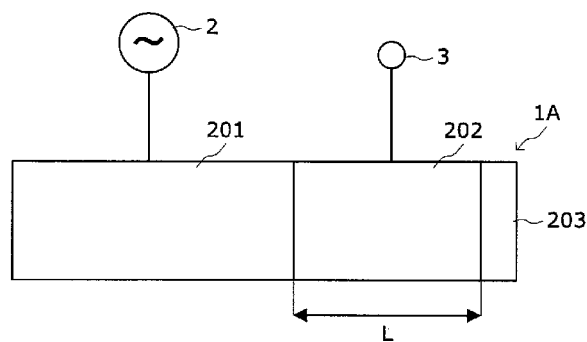
FIG. 3 is a block diagram illustrating a configuration of a semiconductor device having a semiconductor laser according to a second embodiment of the present invention.

FIG. 3 is a block diagram illustrating a semiconductor device provided with a semiconductor laser 1A according to the second embodiment. The semiconductor laser 1A includes a distributed feedback (DFB) region 201 that is an active layer with a DFB structure, a waveguide region 202, and a high-reflection film (reflective mirror) 203. The DFB region 201 is connected to a current source 2 for a modulation signal. The waveguide region 202 is connected to a voltage source 3 (or current source) for phase adjustment, which will be described later.

The DFB region 201 is formed from a bulk active layer as in the first embodiment, and excites the TE mode and the TM mode.

The waveguide region 202 is formed continuously in the waveguide direction of the DFB region 201. The waveguide region 202 guides both the TE mode and the TM mode. The waveguide region 202 has a predetermined feedback waveguide length L in the waveguide direction.

The waveguide region 202 may include a phase adjustment function in addition to a function as the waveguide for feedback of the TE mode and the TM mode, and the phase of each of the TE mode and the TM mode may be adjusted by a voltage applied from the voltage source 3 to control the resonance frequency. Further, for example, an electrode or a thermoelectric element may be provided adjacent to the waveguide region 202, and the executing refractive index of the waveguide region 202 may be controlled by using the electro-optical effect or the thermo-optical effect to control the frequency difference between the TE mode and the TM mode.

The high-reflection film 203 is continuously formed at the end of the waveguide region 202 on the opposite side to the DFB region 201 in the waveguide direction. The high-reflection film 203 reflects light guided through the waveguide region 202 and returns the light to the DFB region 201.

Next, the operation of the semiconductor laser 1A according to the present embodiment will be described.

First, oscillation light is generated in the DFB region 201 by current injection from the current source 2. The oscillation light is reflected by the high-reflection film 203 via the waveguide region 202 and returned to the DFB region 201 again. Assuming that the feedback time of the light at this time is τ, the feedback waveguide length is L, the group refractive index of the TE mode is $n_{gTE}$, and the group refractive index of the TM mode is $n_{gTM}$, a frequency difference f expressed by the following formula (2) occurs in feedback light between the TE mode and the TM mode due to an optical delay.

Formula 2

$$f = \frac{1}{\tau} = \frac{c}{2L|n_{gTE} - n_{gTM}|} \quad (2)$$

In the above formula (2), c is light speed in a vacuum.

As can be seen from the above formula (2), the resonance frequency of the semiconductor laser 1A is determined by the feedback waveguide length L and the executing refractive indices $n_{gTE}$, $n_{gTM}$ of the TE mode and the TM mode.

In the present embodiment, an asymmetric structure is formed in which the aspect ratio of the cross-section of the waveguide region 202 in a direction perpendicular to the waveguide direction is shifted from 1. Thereby, the group refractive indices for TE polarization and TM polarization are set to be different, and a bandgap wavelength is set on the short wavelength side with respect to the oscillation wavelength (oscillation frequency) of the semiconductor laser 1A. For example, when the operating wavelength of the semiconductor laser 1A is in the vicinity of 1.55 μm, the bandgap wavelength is set to 1.2 μm.

With such a configuration, the coupling between the TE mode and the TM mode occurs in the DFB region 201 or the waveguide region 202, so that a resonance frequency higher than the relaxation-oscillation frequency in the semiconductor laser 1A is generated, and a faster modulation operation is realized.

Figure 4:
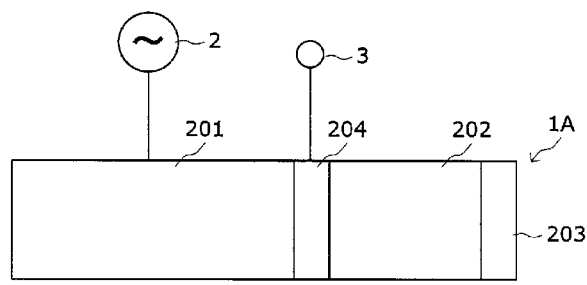
FIG. 4 is a block diagram illustrating a modification example of the second embodiment of the present invention.

Note that the phase adjustment function of the waveguide region 202 may be provided separately from the waveguide region 202 as illustrated in FIG. 4. For example, as illustrated in FIG. 4, a phase adjustment region 204 having a phase adjustment function may be formed between the DFB region 201 and the waveguide region 202.

Third Embodiment

Next, a third embodiment of the present invention will be described. In the following description, the same components as those of the first and second embodiments described above are denoted by the same reference numerals, and description thereof will be omitted.

Figure 5:
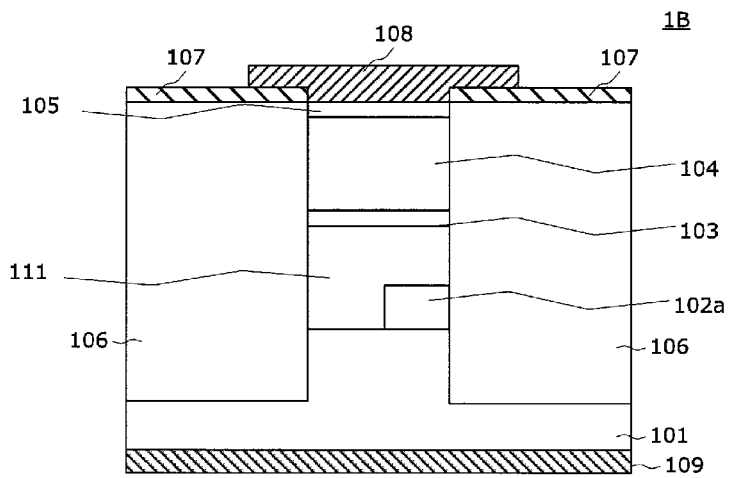
FIG. 5 is a cross-sectional view illustrating a configuration of a semiconductor laser according to a third embodiment of the present invention.

In the first embodiment, the case has been described where the active layer 102 is formed having a rectangular cross-sectional shape perpendicular to the waveguide direction and having an aspect ratio close to 1. In contrast, in the third embodiment, all or a part of the waveguide illustrated in FIG. 2B is formed to embed an active layer iota in an embedding layer in that is formed of a semiconductor layer, as illustrated in FIG. 5. The cross-sectional shape of the active layer iota perpendicular to the waveguide direction is formed to be unevenly distributed with respect to a region into which a current of a semiconductor laser 1B is injected. The active layer iota and the embedding layer 111 constitute a part of a resonator of the semiconductor laser 1B.

The provision of the active layer iota having such a configuration brings the fundamental mode into a mixed state of the TE mode and the TM mode, and the mixed state of the polarized waves changes at the time of light propagation in the resonator, whereby polarized-wave rotation occurs. As described above, the coupling of the TE mode and the TM mode results from transition of a TE mode component to a TM mode component and transition of the TM mode component to the TE mode component. Therefore, by the formation of the asymmetric waveguide shape and the combination with the symmetric waveguide, the interaction between the TE mode and the TM mode becomes stronger in the semiconductor laser 1B, and a higher light-light interaction can be obtained.

Fourth Embodiment

Next, a third embodiment of the present invention will be described. In the following description, the same components as those of the first to third embodiments described above are denoted by the same reference numerals, and description thereof will be omitted.

In the third embodiment, the case has been described where the shape of the active layer 102a in the cross-sectional view is unevenly distributed with respect to the region into which current is injected. In contrast, in a semiconductor laser 1C according to the fourth embodiment, a cross-section of the whole or a part of the waveguide illustrated in FIG. 2B, which is perpendicular to a waveguide direction of an active layer 102b, has an asymmetric shape as illustrated in FIGS. 6A to 6C.

Figure 6A:
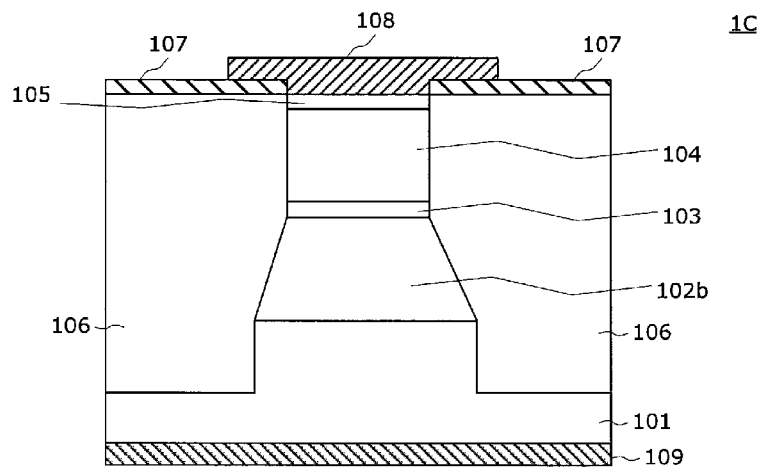
FIG. 6A is a cross-sectional view illustrating a configuration of a semiconductor laser according to a fourth embodiment of the present invention.
Figure 6B:
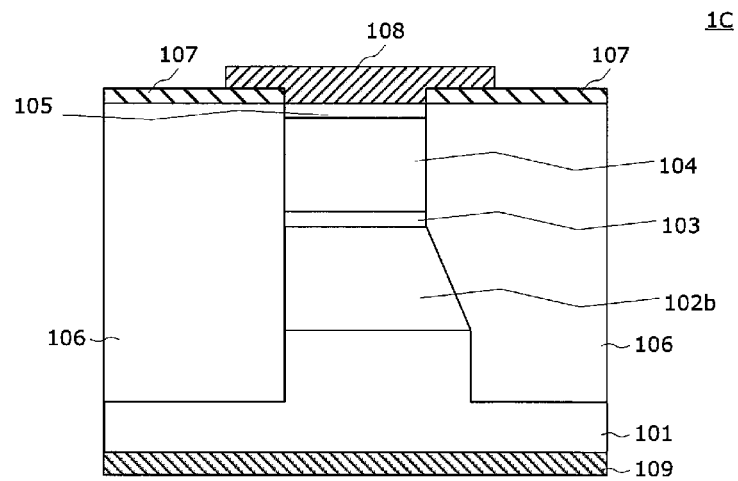
FIG. 6B is a cross-sectional view illustrating the configuration of the semiconductor laser according to the fourth embodiment of the present invention.
Figure 6C:
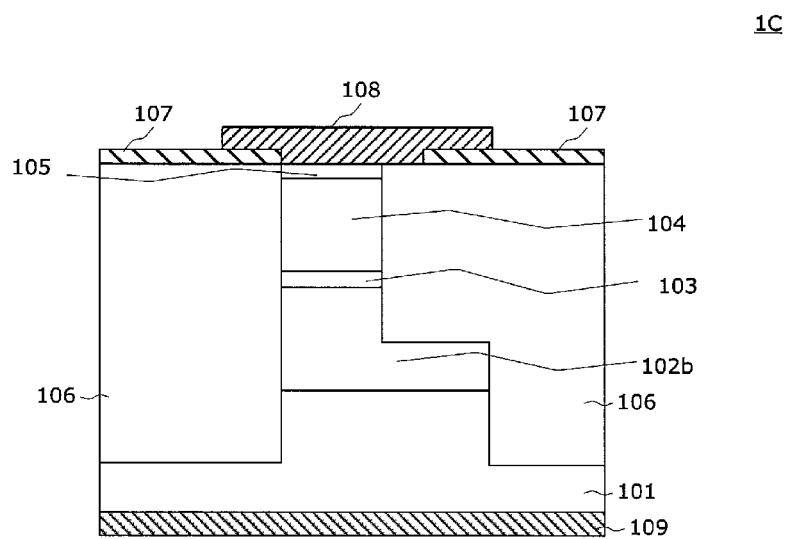
FIG. 6C is a cross-sectional view illustrating the configuration of the semiconductor laser according to the fourth embodiment of the present invention.

For example, as illustrated in FIG. 6A, the cross-sectional shape of the active layer 102b perpendicular to the waveguide direction may be formed in a non-isosceles trapezoidal shape. Further, as illustrated in FIG. 6B, the cross-sectional shape of the active layer 102b perpendicular to the waveguide direction may be formed in a right trapezoidal shape. Moreover, as illustrated in FIG. 6C, the cross-sectional shape of the active layer 102 perpendicular to the waveguide direction may be formed in a stepped shape.

The provision of the active layer 102b, having such a structure causes polarized-wave rotation at the time of light propagation in a resonator in the semiconductor laser 1C, whereby the interaction between the TE mode and the TM mode becomes stronger, and a higher light-light interaction can be obtained. Note that the asymmetric cross-sectional shape of the active layer 102b may be designed in accordance with a target coupling coefficient between the TE mode and the TM mode.

Fifth Embodiment

Next, a fifth embodiment of the present invention will be described. In the following description, the same components as those of the first to fourth embodiments described above are denoted by the same reference numerals, and description thereof will be omitted.

Figure 7A:
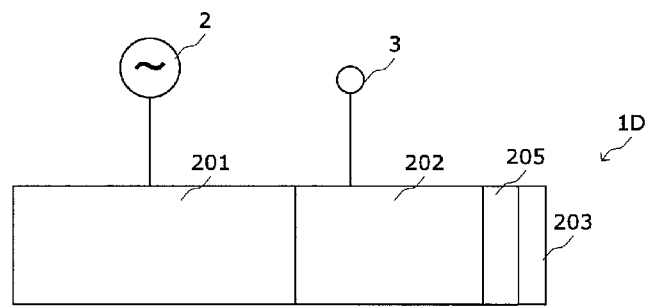
FIG. 7A is a block diagram illustrating a configuration of a semiconductor device having a semiconductor laser according to a fifth embodiment of the present invention.

In the second embodiment, the case has been described where the waveguide region 202 functioning as the feedback path of the TE mode and the TM mode and having the phase adjustment function is used in the semiconductor laser 1A. In contrast, as illustrated in FIG. 7A, a semiconductor laser 1D according to the fifth embodiment further includes a polarization rotation region 205 formed continuously with the waveguide region 202.

The polarization rotation region 205 rotates the polarization planes of the TE mode and the TM mode. The polarization rotation region 205 is formed between the waveguide region 202 and the high-reflection film 203. Similarly to the cross-sectional shapes (FIG. 5 and FIGS. 6A to 6C) of the active layers 102a, 102b, described in the third embodiment and the fourth embodiment, the polarization rotation region 205 is unevenly distributed with respect to a region into which current is injected or has a cross-section in an asymmetric shape.

The polarization rotation region 205 is formed into the shape as described above, and the bandgap wavelength is set on the short wavelength side with respect to the operating wavelength of the semiconductor laser 1D. For example, when the operating wavelength is 1.55 μm, the wavelength is set to 1.2 μm. As a result, a stronger interaction can be generated between the TE mode and the TM mode.

Figure 7B:
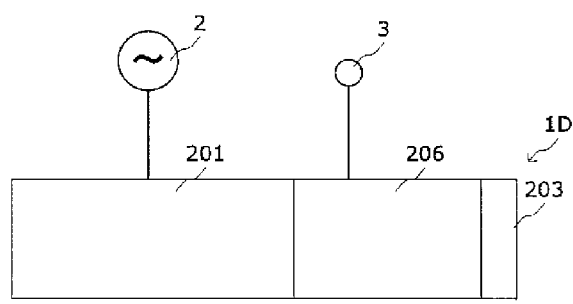
FIG. 7B is a block diagram illustrating the configuration of the semiconductor device having the semiconductor laser according to the fifth embodiment of the present invention.

The polarization rotation region 205 may be formed in the same region as the waveguide region 202 having the phase adjustment function. For example, as illustrated in FIG. 7B, a waveguide region 206 having a function as the waveguide, a phase adjustment function, and a polarization rotation function may be provided between the DFB region 201 and the high-reflection film 203.

Figure 8A:
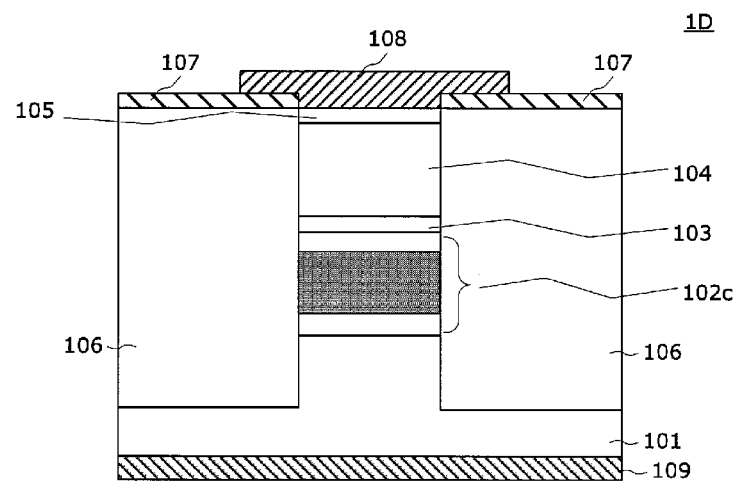
FIG. 8A is a cross-sectional view illustrating the configuration of the semiconductor laser according to the fifth embodiment of the present invention.
Figure 8B:
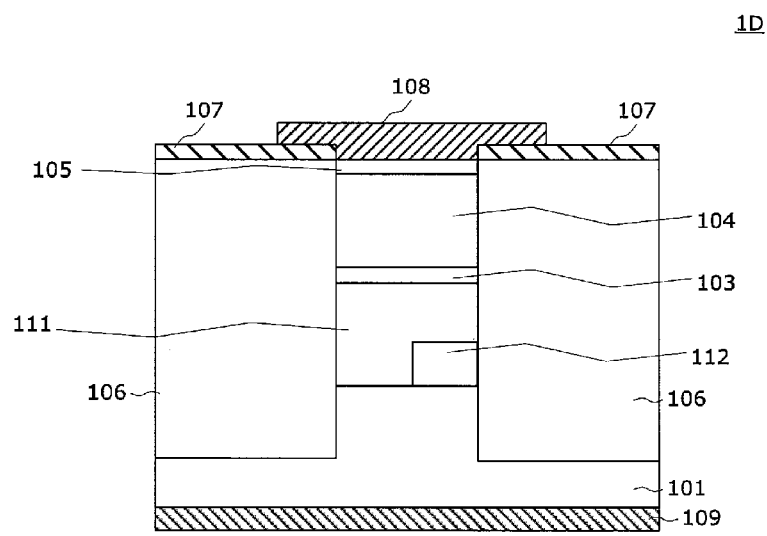
FIG. 8B is a cross-sectional view illustrating the configuration of the semiconductor laser according to the fifth embodiment of the present invention.

Next, FIGS. 8A and 8B illustrate the cross-sectional views of the semiconductor laser 1D provided with the waveguide region 206 having the polarization rotation function and the phase adjustment function.

In the example of the cross-sectional view of the semiconductor laser 1D illustrated in FIG. 8A, a multiple quantum well structure is used for the active layer 102C. Note that FIG. 8A illustrates a cross-sectional view of the semiconductor laser 1D in a portion including the DFB region 201 illustrated in FIG. 7B. By adopting the quantum well structure for the active layer 102C, an interaction between the carrier and the light becomes stronger and a differential gain is increased, so that the high-speed operation can be realized.

In the example of the cross-sectional view of the semiconductor laser 1D illustrated in FIG. 8B, a waveguide layer 112, unevenly distributed with respect to a region into which current is injected, is formed. Note that FIG. 8B illustrates a cross-sectional view of the semiconductor laser 1D in a portion including the waveguide region 206 illustrated in FIG. 7B. The bandgap wavelength of the waveguide layer 112 is set to 1.2 μm. Electrodes for current injection are provided above and below the waveguide layer 112, and the refractive index of the waveguide layer 112 is controlled by injection of a current by a forward bias voltage or an electric field effect by a reverse bias voltage, to adjust phase conditions.

Although the embodiments of the semiconductor laser according to the present invention have been described above, the present invention is not limited to the described embodiments, and various modifications that can be assumed by a person skilled in the art can be made within the scope of the invention recited in the claims.

For example, in the first to fourth embodiments described, the active layer having the bulk structure has been used, but an active layer having a quantum well structure may be used instead as in the fifth embodiment. Specifically, the waveguide is formed into a structure in which the longitudinal ratio is smaller in the aspect ratio of the active layer, and a quantum well layer having elongation strain is used for the active layer. As a result, while the TE mode becomes the main mode as the waveguide mode, since the optical gain of the TM polarization is increased, the effects of both modes are canceled, and excitation in both the TE mode and the TM mode becomes possible.

Alternatively, a structure is formed in which the longitudinal ratio is larger in the aspect ratio of the active layer, and a quantum well having no strain or compressive strain is used for the active layer. As a result, while the TM mode becomes the main mode as the waveguide mode, since the excitation on the TE side is increased, the effects of both modes are canceled, and excitation in both the TE mode and the TM mode becomes possible.

Although the InGaAsP material has been used for the semiconductor laser in the described embodiments, it is obvious that embodiments of the present invention can also be applied to a semiconductor laser using another semiconductor material such as InGaAlAs or AlGaAs.

Further, in the described embodiments, the waveguide has been formed in the semiconductor laser structure with semi-insulating embedding, but since the present invention operates by setting the waveguide characteristic in both modes of the TE polarization and the TM polarization, even when a p-n embedding structure or a ridge structure is used, the same effect as that of the present embodiment can be achieved by designing the waveguide mode.

REFERENCE SIGNS LIST 1, 1A, 1B, 1C, 1D Semiconductor laser
12 Inner wall
101 Lower cladding layer
102 Active layer
103 Diffraction grating
104 Upper cladding layer
105 Contact layer 106 High-resistance layer
107 Insulating film
108 P-type electrode
109 N-type electrode
110 High-reflection film.

The invention claimed is:

1. A semiconductor laser comprising:
an active layer that excites two modes of light and is comprised in a resonator guiding the two modes of light, the two modes of light comprising a first mode of light and a second mode of light;
wherein a frequency difference setting structure of the semiconductor laser sets a difference between a first oscillation frequency of the first mode of light and a second oscillation frequency of the second mode of light, the difference being higher than a relaxation-oscillation frequency:
wherein the active layer has a distributed feedback structure; and
wherein the resonator further includes:
a waveguide region along a sidewall of the active layer; and
a reflective mirror along a sidewall of the waveguide region, wherein the reflective mirror is on an opposite side of waveguide region as the active layer, and
wherein the two modes of light excited by the active layer is configured to be guided in the waveguide region, reflected by the reflective mirror, and fed back to the active layer.

2. The semiconductor laser according to claim 1, wherein the distributed feedback structure has a diffraction grating periodically disposed along a waveguide direction, and wherein the frequency difference setting structure is provided by the diffraction grating.

3. The semiconductor laser according to claim 1, wherein the waveguide region includes a phase adjustment region that adjusts a phase of the two modes of light.

4. The semiconductor laser according to claim 1, wherein the waveguide region includes a polarization rotation region that rotates a polarization plane of the two modes of light.

5. The semiconductor laser according to claim 1, wherein the active layer is unevenly distributed with respect to a region in a cross-section perpendicular to a waveguide direction of the resonator, and wherein current is injected into the region.

6. The semiconductor laser according to claim 1, wherein a cross-section of the active layer perpendicular to a waveguide direction of the resonator has an asymmetric shape.

7. The semiconductor laser according to claim 1, wherein the two modes of light is a transverse electric (TE) mode of light and a transverse magnetic (TM) mode of light.

8. A method of forming a semiconductor laser, the method comprising:
forming an active layer that excites two modes of light, wherein the active layer has a distributed feedback structure;
forming a waveguide region along a sidewall of the active layer; and
forming a reflective mirror along a sidewall of the waveguide region, wherein the reflective mirror is on an opposite side of waveguide region as the active layer, wherein the two modes of light excited by the active layer is configured to be guided in the waveguide region, reflected by the reflective mirror, and fed back to the active layer;
wherein the active layer is comprised in a resonator guiding the two modes of light, the two modes of light comprising a first mode of light and a second mode of light; and
wherein a frequency difference setting structure of the semiconductor laser sets a difference between a first oscillation frequency of the first mode of light and a second oscillation frequency of the second mode of light, the difference being higher than a relaxation-oscillation frequency.

9. The method according to claim 8, wherein the distributed feedback structure has a diffraction grating periodically disposed along a waveguide direction, and wherein the frequency difference setting structure is provided by the diffraction grating.

10. The method according to claim 8, wherein forming the waveguide region includes forming a phase adjustment region that adjusts a phase of the two modes of light.

11. The method according to claim 8, wherein forming the waveguide region includes forming a polarization rotation region that rotates a polarization plane of the two modes of light.

12. The method according to claim 8, wherein the two modes of light is a transverse electric (TE) mode of light and a transverse magnetic (TM) mode of light.

* * * * *